United States Patent
Oyanagi et al.

(10) Patent No.: US 7,993,453 B2
(45) Date of Patent: Aug. 9, 2011

(54) METHOD FOR PRODUCING SILICON CARBIDE SINGLE CRYSTAL

(75) Inventors: Naoki Oyanagi, Chiba (JP); Tomohiro Syounai, Chiba (JP); Yasuyuki Sakaguchi, Chiba (JP)

(73) Assignee: Showa Denko K.K., Tokyo (JP)

( * ) Notice: Subject to any disclaimer, the term of this patent is extended or adjusted under 35 U.S.C. 154(b) by 265 days.

(21) Appl. No.: 12/301,383

(22) PCT Filed: May 10, 2007

(86) PCT No.: PCT/JP2007/060169
§ 371 (c)(1),
(2), (4) Date: Feb. 2, 2009

(87) PCT Pub. No.: WO2007/135965
PCT Pub. Date: Nov. 29, 2007

(65) Prior Publication Data
US 2009/0184327 A1    Jul. 23, 2009

(30) Foreign Application Priority Data
May 18, 2006    (JP) .................................. 2006-138684

(51) Int. Cl.
*C30B 19/12*    (2006.01)
*C30B 25/20*    (2006.01)
(52) U.S. Cl. ............ 117/35; 117/58; 117/106; 117/902; 117/915; 117/951
(58) Field of Classification Search ............ 117/35, 117/58, 106, 902, 915, 951
See application file for complete search history.

(56) References Cited

U.S. PATENT DOCUMENTS

| 5,736,753 A * | 4/1998 | Ohno et al. ..................... 257/77 |
| 5,958,132 A * | 9/1999 | Takahashi et al. .............. 117/84 |
| 6,786,969 B2 * | 9/2004 | Kondo et al. .................. 117/200 |
| 6,890,600 B2 * | 5/2005 | Nakamura et al. ......... 423/328.2 |

(Continued)

FOREIGN PATENT DOCUMENTS

JP    05262599    * 10/1993

(Continued)

*Primary Examiner* — Evan Pert
(74) *Attorney, Agent, or Firm* — Sughrue Mion, PLLC

(57) ABSTRACT

A method for the production of an SiC single crystal includes the steps of growing a first SiC single crystal in a first direction of growth on a first seed crystal formed of an SiC single crystal, disposing the first SiC single crystal grown on the first seed crystal in a direction parallel or oblique to the first direction of growth and cutting the disposed first SiC single crystal in a direction of a major axis in a cross section perpendicular to the first direction of growth to obtain a second seed crystal, using the second seed crystal to grow thereon in a second direction of growth a second SiC single crystal to a thickness greater than a length of the major axis in the cross section, disposing the second SiC single crystal grown on the second seed crystal in a direction parallel or oblique to the second direction of growth and cutting the disposed second SiC single crystal in a direction of a major axis in a cross section perpendicular to the second direction of growth to obtain a third seed crystal, using the third seed crystal to grow thereon a third SiC single crystal, and cutting the third SiC single crystal grown on the third seed crystal in such a manner as to expose a {0001} crystal face, thereby obtaining an SiC single crystal. The method enables the crystal to be enlarged efficiently without impairing crystallinity.

6 Claims, 2 Drawing Sheets

U.S. PATENT DOCUMENTS 7,048,798 B2 * 5/2006 Maruyama et al. ............ 117/109
7,135,074 B2 * 11/2006 Gunjishima et al. .......... 117/101
7,192,482 B2 * 3/2007 Mueller et al. ................. 117/84

FOREIGN PATENT DOCUMENTS

| | | |
|---|---|---|
| JP | 11-268989 A | 10/1999 |
| JP | 2001-253799 A | 9/2001 |
| JP | 2003-527298 A | 9/2003 |
| JP | 2004-99340 A | 4/2004 |
| WO | 01/68957 A1 | 9/2001 |
| WO | 2004/008506 A1 | 1/2004 |

* cited by examiner

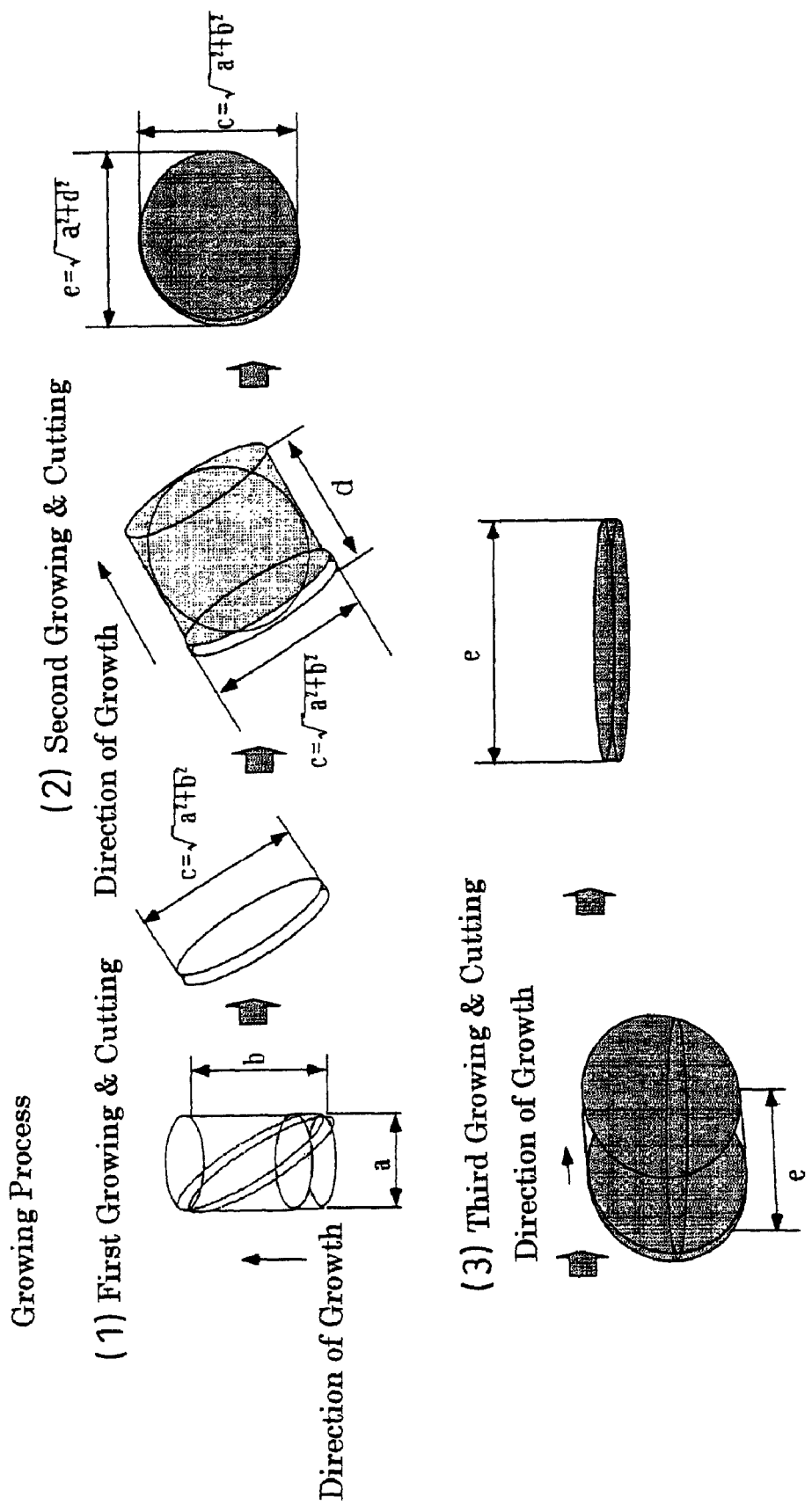

METHOD FOR PRODUCING SILICON CARBIDE SINGLE CRYSTAL

CROSS REFERENCE TO RELATED APPLICATIONS

This application is an application filed under 35 U.S.C. §111(a) claiming the benefit pursuant to 35 U.S.C. §119(e)(1) of the filing date of Japanese Patent Application No. 2006-138684 filed May 18, 2006 pursuant to 35 U.S.C. §111(b).

TECHNICAL FIELD

This invention relates to a method for producing a single crystal of silicon carbide (SiC) and particularly to a method for producing an SiC single crystal in which the growth of crystal is attained by a method of growth directed to the production of an SiC single crystal having a large size and superior quality.

BACKGROUND ART

SiC is a material which is physically and chemically stable as evinced by abounding in thermal conductivity, generally excelling in thermal resistance and mechanical strength and tolerating radial rays and which has a broad energy band gap. Thus, it can be utilized as the material for an environment-proof device usable even at an elevated temperature, the material for a device resisting radiant rays, the material for a power device specializing in power control, the material for a short-wavelength light-emitting device, etc. In recent years, it has been attracting general attention as a power device specializing in power control and has been undergoing enthusiastic development.

For the purpose of disseminating the SiC single crystal as the material for the power device specializing in power control, this crystal is naturally required to be perfectly free from faults, such as dislocations. For the sake of lowering the cost of the device, it is as well required to be a wafer of a large diameter.

In order to manufacture this wafer having a large diameter and not suffering from any appreciable fault, a seed crystal that has a large diameter and a low defect density is an indispensable necessity.

The generally available SiC seed crystal excelling in quality, however, is a crystal (Lely crystal) that is made by the sublimation and recrystallization method using no seed crystal and called the Lely method. The Lely method incurs difficulty in enabling addition to diameter and barely allows the production of a crystal approximating to 1 cm² at most.

The large SiC single crystal available to date has been produced by using the Lely crystal as a seed crystal, repeating growth of crystal in the same direction (mainly in the direction of the c-axis) by using the sublimation and recrystallization method called the modified Lely method, and enlarging the crystal in the direction of the a-axis little by little.

The enlargement of size in the direction of the a-axis, therefore, has necessitated a great deal of time. The production of a crystal measuring 2 inches from a crystal measuring approximately 1 inch, for example, has required time exceeding one year.

For the purpose of solving the problems mentioned above, methods for attaining growth of crystal by joining small seed crystals side by side like the case of tiles (refer to JP-A HEI 11-268989 and JP-A 2003-527298), a method for preparing a seed crystal by joining SiC single crystals (refer to JP-A 2001-253799), and a method that comprises growing cubic SiC on an Si substrate enabling production of a wafer of large diameter, depriving the grown cubic SiC of the Si substrate and then subjecting the cubic SiC to heat treatment, thereby converting it into hexagonal SiC, such as of a 4H-type (refer to JP-A HEI 11-268995), have been disclosed.

When what is obtained by joining small seed crystals is grown as a seed crystal or a substrate, the grown product has the quality thereof lowered by suffering crystal faults, such as dislocations or micropipes, to emanate from the boundary surface of the resultant joint. When a crystal of large diameter is obtained by using an Si substrate, this crystal cannot acquire a fully satisfactory quality because the crystal defect that occurs in consequence of mismatching between lattice constants of Si and SiC survives after the heat treatment.

This invention is aimed at providing a method for the production of an SiC single crystal that is capable of accomplishing enlargement of crystal efficiently without entailing a crystal defect.

DISCLOSURE OF THE INVENTION

This invention has been completed for the purpose of fulfilling the object mentioned above and comprises the following aspects.

To be specific, the first aspect of the invention provides a method for the production of an SiC single crystal, comprising the steps of growing a first SiC single crystal in a first direction of growth on a first seed crystal formed of an SiC single crystal, disposing the first SiC single crystal grown on the first seed crystal in a direction parallel or oblique to the first direction of growth and cutting the disposed first SiC single crystal in a direction of a major axis in a cross section perpendicular to the first direction of growth to obtain a second seed crystal, using the second seed crystal to grow thereon in a second direction of growth a second SiC single crystal to a thickness greater than a length of the major axis in the cross section, disposing the second SiC single crystal grown on the second seed crystal in a direction parallel or oblique to the second direction of growth and cutting the disposed second SiC single crystal in a direction of a major axis in a cross section perpendicular to the second direction of growth to obtain a third seed crystal, using the third seed crystal to grow thereon a third SiC single crystal, and cutting the third SiC single crystal grown on the third seed crystal in such a manner as to expose a {0001} crystal face, thereby obtaining an SiC single crystal.

The second aspect of the invention includes the configuration of the first aspect, wherein the first SiC single crystal is grown on the first seed crystal in a thickness greater than a diameter of a surface of the first seed crystal.

The third aspect of the invention includes the configuration of the first or second aspect, wherein the direction parallel or oblique to the first or second direction of growth has an angle of 0° or more and less than 90° from the first or second direction of growth.

The fourth aspect of the invention includes the configuration of any one of the first to third aspects, wherein the third SiC single crystal grown has a thickness greater than a length of a major axis of a surface of the third seed crystal.

The fifth aspect of the invention includes the configuration of the first to fourth aspects, wherein the seed crystal is obtained from any of the steps of growing in any one of the first to fourth aspects.

The sixth aspect of the invention includes the configuration of any one of the first to fifth aspect, wherein the SiC single crystal is grown by having a temperature of a crystal-growing part of the seed crystal set in a range of 1800° C. to 2300° C.

and a temperature of a raw material of SiC single crystal set in a range of 2000° C. to 2400° C. and at a level higher than the temperature of the crystal-growing part.

The seventh aspect of the invention provides an SiC single crystal obtained by the method of any one of the first to sixth aspects.

The eighth aspect of the invention provides an SiC single crystal obtained by the method of the seventh aspect, wherein it has an orientation consisting in {0001} or forming an offset of ±30° relative to {0001}.

The ninth aspect of the invention provides a semiconductor device using the SiC single crystal of the seventh or eighth aspect.

The tenth aspect of the invention provides an inverter formed of the semiconductor device of the ninth aspect.

In the method for the production of a single crystal that comprises supplying a vapor gas from SiC as a raw material at a high temperature to a seed crystal formed of an SiC single crystal, thereby inducing growth of an SiC single crystal, a large seed crystal is obtained by cutting the grown crystal in parallel or obliquely to the direction of growth. A large single crystal can be efficiently obtained without impairing crystallinity by growing a single crystal with the seed crystal, subsequently cutting this single crystal in the same manner as described above, thereby manufacturing a still larger seed crystal, and repeating the growth of a single crystal.

The above and other objects, characteristic features and advantages of the present invention will become apparent to those skilled in the art from the description given herein below with referent to the accompanying drawings.

BRIEF DESCRIPTION OF THE DRAWINGS

FIG. 2 is an explanatory diagram illustrating directions of crystal cutting.

BEST MODE FOR CARRYING OUT THE INVENTION

Figure 1:
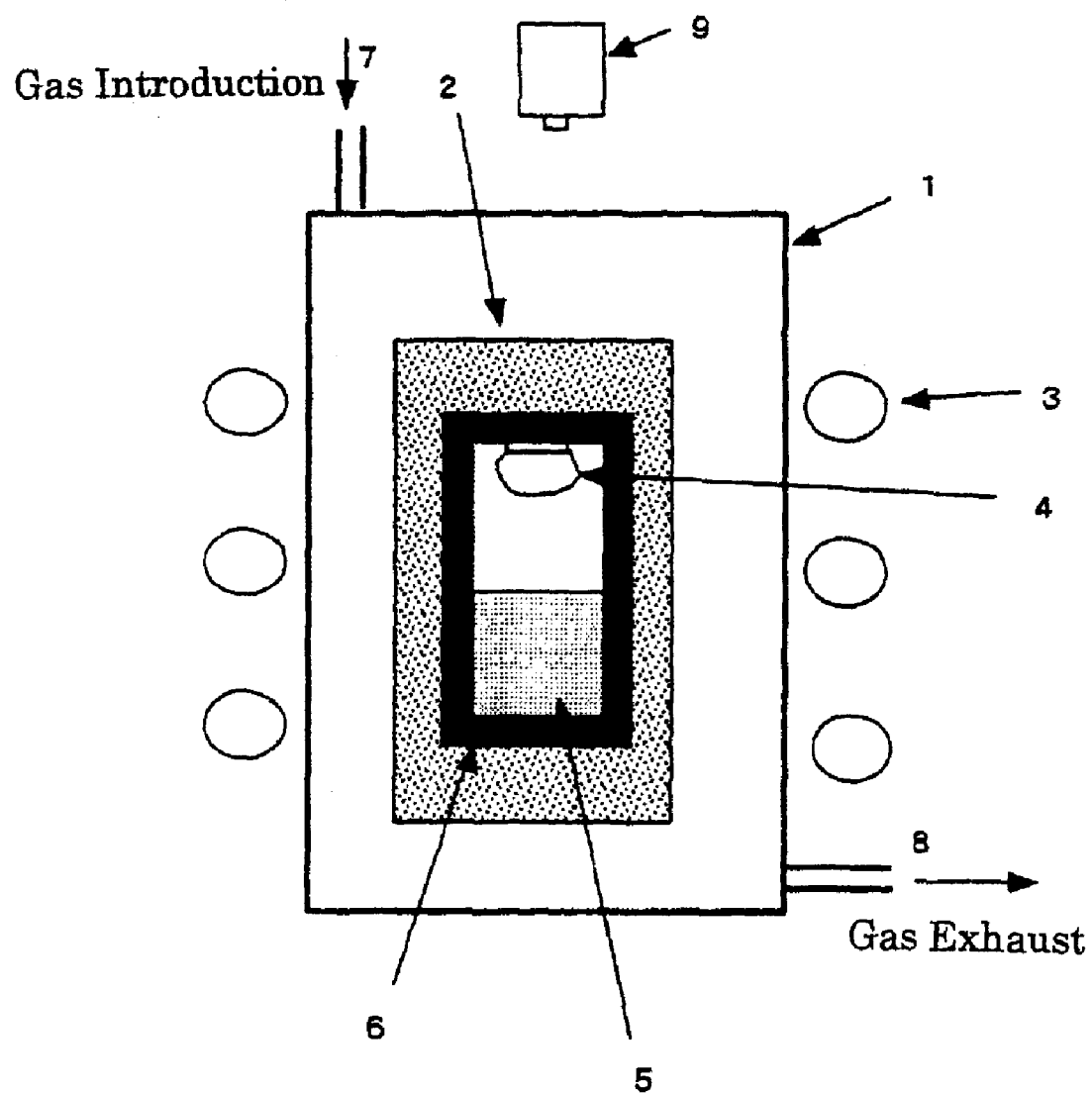
FIG. 1 illustrates one example of the cross section of a device used in this invention for the growth of crystal.

The method for the production of an SiC single crystal contemplated by this invention is fundamentally a method that comprises supplying a sublimation gas from SiC as the raw material at a high temperature exceeding 2000° C. to a seed crystal formed of an SiC single crystal, thereby effecting growth of an SiC single crystal on the seed crystal.

This method of growth can be applied to all the methods directed to growing a single crystal, such as the Chemical Vapor Deposition method (CVD method) using silane or propane as the raw material in the place of sublimation gas or the liquid phase growth method effecting growth by using Si melt as a solvent.

This invention concerns a method that comprises the steps of growing a first single crystal with a first seed crystal, manufacturing a second seed crystal therefrom, growing a second single crystal, manufacturing a third seed crystal therefrom and manufacturing a final product of single crystal, and repeating these steps to manufacture single crystals. This method is characterized by enabling the successively manufactured seed crystals to acquire gradually enlarged sizes by specially selecting the direction of cutting the relevant grown single crystals.

To be specific, first this invention causes a seed crystal (first seed crystal) formed of an SiC single crystal to grow an SiC single crystal preferably to a length (thickness of growth) greater than the major axis of the seed crystal. The seed crystal is circular, oval or rectangular in shape. The major axis is a diameter in the case of a circle, a major-axis length in the case of an ellipse or the length of a long side in the case of a rectangle. The seed crystal to be selected prefers to be destitute of crystal defects to the fullest possible extent. From the second manufacture onward, the single crystals obtained by this invention can be used as the seed crystal.

From the single crystal consequently obtained, a seed crystal (second seed crystal) is manufactured. This seed crystal is manufactured by cutting the single crystal in the direction parallel or oblique to the direction of growth. The parallel or oblique direction means an angle of 0° or more and less than 90°, preferably 0° or more and 45° or less, relative to the axial direction of growth. The reason for specifying this particular range consists in enabling the length of the axial direction of growth on the cut oblique surface to be increased as much as possible.

Now, the case wherein the first seed crystal is circular in shape and the cutting is made in an oblique direction will be described below (refer to FIG. 2).

When the first seed crystal is circular in shape and the grown single crystal is cut in an oblique direction, the cross section formed in the second seed crystal perpendicularly to the direction of growth is oval in shape. Let a stand for the diameter of the circle of the first seed crystal and b stand for the height of the sectioned part of the single crystal, and the length in the direction of minor axis of the cross section of the second seed crystal will be a and the length in the direction of major axis will be the square root of $[a^2+b^2]$ (FIG. 2(1)).

This second seed crystal is made to grow a second SiC single crystal. The grown single crystal is in the shape of a columnar body having an oval cross section. Its length (thickness of growth) is greater than the length of major axis.

Next, this columnar body is manufactured into a third seed crystal. The method of this manufacture consists in cutting the columnar single crystal parallel to the direction of length or obliquely to the direction of length. The oblique angle is the same as mentioned above. The direction in which the cutting is made in the cross section is the direction of long axis of the elliptical shape in order to enlarge the area of the seed crystal to the fullest possible extent. Let d stand for the height of the single crystal at the point of cutting, and the length c of minor axis of the surface of the third seed crystal will be the square root of $[a^2+b^2]$ and the length of major axis thereof will be the square root of $[a^2+d^2]$ on the assumption of b<d (FIG. 2(2)). By repeating this procedure, it is made possible to give gradually increased areas to the successively produced seed crystals. This third seed crystal is made to grow a single crystal (FIG. 2(3)). This growth incurs no particular limitation in length when the single crystal resulting from the growth will not be manufactured into a seed crystal. The length of the grown single crystal nevertheless prefers to be greater than the length of major axis of seed crystal used. Finally, by cutting the grown single crystal so as to expose a {0001} crystal face, it is made possible to obtain an SiC single crystal as a manufactured article.

Incidentally, the foregoing description has covered the procedure up to the point of growing a third single crystal on the third seed crystal. Here, by obtaining a seed crystal from the grown single crystal and further making the obtained seed crystal grow a single crystal, from thence repeating this procedure till the finally obtained single crystal is cut so as to expose the {0001} crystal face and give rise to an SiC single crystal as a manufactured article, it is rendered possible to obtain a still larger single crystal.

For the cutting that is implemented during the manufacture of the seed crystal mentioned above, while the cutting with an outside perimeter cutting edge, the cutting with an inner perimeter cutting edge, the cutting with a wire saw, etc. are available, the cutting with a wire saw proves to be particularly preferable.

Now, the method of this invention for growing a single crystal will be specifically described below by reference to the accompanying drawings.

One example of the device of this invention for growing a single crystal is illustrated in FIG. 1. One embodiment of this invention will be described by reference to FIG. 1. Referring to FIG. 1, reference numeral 1 denotes a vacuum chamber, which is made of a material, such as quartz or stainless steel, that is capable of retaining a high degree of vacuum, numeral 2 denotes a heat insulating material, and numeral 6 denotes a graphite crucible. In the upper part of the crucible that is fated to serve as a crystal-growing part, a seed crystal 4, namely an SiC seed crystal, is fixed. The graphite crucible and the heat insulating material prefer to use a carbonaceous material that has undergone a refining treatment with a halogen gas. The lower part of the graphite crucible 6 has a size so large as to store an SiC raw material 5 in an amount sufficient for the growth of crystal. For the purpose of heating the crucible 6, a high-frequency heating coil 3 is rolled around the periphery of the crucible. The vacuum chamber 1 exhausts the air via an outlet 8 by a vacuum pump. It is supplied with argon gas of high purity via an inlet 7 and consequently allowed to retain therein an atmosphere of argon in a decompressed state.

This invention implements growth of SiC crystal by using an apparatus for the production of an SiC single crystal illustrated in FIG. 1 as follows. As the seed crystal for this growth, Acheson crystal, Lely crystal, a single crystal obtained by the sublimation and recrystallization method, or the like is used. The crystal orientation may be any one of {0001}, {10-10} and {11-20} and may tolerate presence of an offset so long as substantial equality is not impaired. As the final finish, the seed crystal prefers to undergo sacrificial oxidation, reactive ion etching, chemical mechanical polishing or the like with a view to removing polishing damage. As the SiC single crystal, the single crystal produced by the Acheson method, the Lely method or the sublimation method is used.

The pretreated seed crystal is fixed to the lid of the crucible and SiC powder fated to serve as the raw material is packed in the crucible at the position opposite the seed crystal. The crucible subsequent to having a heat insulating material installed around the periphery thereof is set at the prescribed position in a heating furnace. As the method of heating, while the high-frequency heating generally prevails, the resistance heating may suffice instead. The heating temperature is adjusted to fall in the range of 1800° C. to 2200° C. in the upper part of the crucible and in the range of 2000° C. to 2400° C. in the lower part of the crucible. The pressure used during the growth is in the range of 660 Pa to 13 kPa.

The seed crystal 4 having undergone the surface treatment as described above is fixed either mechanically or by using a joining method of adhesion to the lid of the graphite crucible in the crystal-growing part. The graphite crucible 6 wherein the SiC raw material powder 5 has been disposed so as to be opposed to the seed crystal 4 is placed in the vacuum chamber 1, which is evacuated by a turbo-molecular pump till an air pressure of $3 \times 10^{-5}$ Torr. Thereafter, the interior of the vacuum chamber is thoroughly displaced with high-purity Ar gas. On the outer side of the graphite crucible 6, a high-frequency coil is installed as the heating device 3 for heating the crucible. This heating device 3 is a device that heats the SiC raw material 5 in the graphite crucible 6 to a temperature exceeding 1900° C., for example, which is capable of causing the raw material to generate a gas by sublimation.

Incidentally, the heating device 3 may be of the type that utilizes resistance heating. For the purpose of maintaining the crucible in the state of high temperature, the crucible prefers to be covered with the heat insulating material 2 made of carbon fibers, for example. During the course of the heating, the coil position, for example, is adjusted in the environment having an Ar atmosphere of 700 Torr so that the crystal-growing part containing the seed crystal may be heated to a temperature in the range of 1800° C. to 2300° C. and the high-temperature part containing the SiC raw material may be heated to a higher temperature in the range of 2000° C. to 2400° C. than the temperature of the crystal-growing part.

The pressure in the environment of crystal growth is gradually decreased to a level in the range of 10 to 150 Torr and the crystal is grown at a speed in the approximate range of 0.5 to 1 mm/h. During this course of growth, an impurity, such as nitrogen or aluminum, may be added to the environment as occasion demands. After the growth is completed, the pressure in the environment of crystal growth is reverted to the original level of 700 Torr and the crucible is cooled.

The crystal withdrawn from the crucible after completion of the growth is cut in the direction parallel or oblique to the direction of growth with an outer perimeter cutting edge or a wire saw. The thickness removed by this cutting is adjusted so as to fall in the approximate range of 0.5 to 5 mm. The crystal thus cut out is subjected to the same polishing method and pretreating method as adopted first and consequently allowed to prepare a seed crystal for the next growth. After the enlargement of crystal to the prescribed size has been attained by repeating this procedure, the enlarged crystal is tested by an X-ray diffraction device to confirm the crystal orientation and subjected to a cutting work and a polishing work that are directed to exposing a necessary crystal face, with the result that a seed crystal of a large diameter or a wafer of a large diameter will be obtained.

Examples of this invention will be cited below. Nevertheless the present invention is not limited to these examples.

Example 1

A seed crystal substrate (50 mm in diameter and 0.4 mm in thickness) using a 4H-SiC single crystal exposing a (000-1) face was washed with a sulfuric acid-hydrogen peroxide mixed solution at 110° C. for 10 minutes, with running ultra-pure water for 5 minutes, with an ammonia-hydrogen peroxide mixed solution for 10 minutes, with running ultrapure water for 5 minutes, with a hydrochloric acid-hydrogen peroxide mixed solution for 10 minutes, with running ultrapure water for 5 minutes and further with an HF solution. Thereafter, it was subjected to surface oxidation at 1200° C. and again to HF washing to be completed as a seed crystal.

In a crucible made of graphite and measuring 50 mm in inside diameter and 95 mm in depth, SiC raw material powder (made by Showa Denko K.K. and sold under the product code of "#240") was packed to a height of 60 mm. Then, the seed crystal was pasted fast on the lower side of the lid for the crucible made of graphite.

This lid was disposed on the opening part of the crucible. The whole graphite crucible was wrapped with a heat insulating material made of carbon fibers and set in a reaction chamber inside a high-frequency heating furnace. The interior of a reaction tube was decompressed to $5 \times 10^{-5}$ Torr via a gas exhaust port 8, then filled to normal pressure with argon gas introduced via an inert gas inlet 7, and subsequently decompressed again to $5 \times 10^{-5}$ Torr via the gas exhaust port so as to expel the air from within the reaction tube. Then, argon gas was introduced via the inert gas inlet till 700 Torrs. The graphite crucible was heated till the upper part thereof reached 2200° C. and the lower part reached a level between 2250 to 2300° C. Thereafter, the gas was expelled via the gas exhaust port, the atmosphere of argon was decompressed till 5.3 kPa, and the growth of crystal was implemented for 20 hours. At this point of time, the growth was temporarily terminated and the raw material powder was replaced with a new supply. By repeating this procedure five times, the growth was enabled to reach a length of 100 mm.

The crystal consequently obtained was cut perpendicularly to the direction of growth and mirror-polished to complete a seed crystal for the next growth. The seed crystal measured 50 mm×100 mm (rectangle). The thickness thereof was 1 mm.

This seed crystal was grown in the same manner as described above till a length of 111 mm. The grown crystal was perpendicularly cut parallel to the surface on the 100 mm side to obtain a seed crystal. The surface of this seed crystal measured 100 mm×111 mm. The thickness thereof was 1 mm.

This seed crystal was further grown till a length of 100 mm. The grown single crystal was tested with an X-ray diffraction device to determine a crystal orientation capable of exposing a {0001} face, cut along the crystal orientation and adjusted in shape, with the result that a single crystal having a diameter of 100 mm was obtained.

Example 2

A crystal tiled by 10° relative to the (000-1) face of a 4H-SiC crystal was adopted as a seed crystal (circle 50 mm in diameter) and subjected to growth of crystal under the same conditions as in Example 1.

On this seed crystal, the first growth was implemented till a length of 90 mm. The grown crystal was cut obliquely at an angle of 30° relative to the direction of growth to obtain an oval seed crystal whose cut surface had a major axis of about 100 mm and a minor axis of 50 mm. The thickness thereof was 1 mm. This oval seed crystal was further grown till a length of 100 mm. The grown crystal was cut obliquely at an angle of 45° relative to the direction of growth and moreover parallel to the major axis to obtain a seed crystal whose major axis and minor axis had nearly equal lengths of 100 mm (practically circular in shape). The thickness thereof was 1 mm.

This circular seed crystal was further grown till a length of 100 mm. The grown crystal consequently obtained was tested with an X-ray diffraction device to determine a crystal orientation capable of exposing a {0001} face, cut along the crystal orientation and adjusted in shape, with the result that a single crystal having a diameter of 100 mm was obtained.

INDUSTRIAL APPLICABILITY

Since SiC excels in thermal conductivity, heat resistance and mechanical strength, the single crystal thereof is used in various applications, as a semiconductor device and as an inverter formed thereof as well. Particularly, the use of the single crystal as a power element for the purpose of controlling electric power has been attracting attention.

The invention claimed is:

1. A method for the production of an SiC single crystal, comprising the steps of:
    growing a first SiC single crystal in a first direction of growth on a first seed crystal formed of an SiC single crystal;
    disposing the first SiC single crystal grown on the first seed crystal in a direction parallel or oblique to the first direction of growth and cutting the disposed first SiC single crystal in a direction of a major axis in a cross section perpendicular to the first direction of growth to obtain a second seed crystal;
    using the second seed crystal to grow thereon in a second direction of growth a second SiC single crystal to a thickness greater than a length of the major axis in the cross section;
    disposing the second SiC single crystal grown on the second seed crystal in a direction parallel or oblique to the second direction of growth and cutting the disposed second SiC single crystal in a direction of a major axis in a cross section perpendicular to the second direction of growth to obtain a third seed crystal;
    using the third seed crystal to grow thereon a third SiC single crystal; and
    cutting the third SiC single crystal grown on the third seed crystal in such a manner as to expose a {0001} crystal face, thereby obtaining an SiC single crystal.

2. A method for the production of an SiC single crystal according to claim 1, wherein the first SiC single crystal is grown on the first seed crystal in a thickness greater than a diameter of a surface of the first seed crystal.

3. A method for the production of an SiC single crystal according to claim 1, wherein the direction parallel or oblique to the first or second direction of growth has an angle of 0° or more and less than 90° from the first or second direction of growth.

4. A method for the production of an SiC single crystal according to claim 1, wherein the third SiC single crystal grown has a thickness greater than a length of a major axis of a surface of the third seed crystal.

5. A method for the production of an SiC single crystal according to claim 1, wherein the seed crystal is obtained by any of the steps of growing in the method of claim 1.

6. A method for the production of an SiC single crystal according to claim 1, wherein the SiC single crystal is grown by having a temperature of a crystal-growing part of the seed crystal set in a range of 1800° C. to 2300° C. and a temperature of a raw material of SiC single crystal set in a range of 2000° C. to 2400° C. and at a level higher than the temperature of the crystal-growing part.

* * * * *